(12) United States Patent
Strzalkowski (10) Patent No.: US 10,903,355 B1
(45) Date of Patent: Jan. 26, 2021

(54) POWER SWITCH ARRANGEMENT

(71) Applicant: Analog Devices International Unlimited Company, Limerick (IE)

(72) Inventor: Bernhard K Strzalkowski, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/698,359

(22) Filed: Nov. 27, 2019

(51) Int. Cl.
| | | |
|---|---|---|
| *H01L 29/78* | (2006.01) | |
| *H01L 29/06* | (2006.01) | |
| *H03K 17/14* | (2006.01) | |
| *H01L 27/02* | (2006.01) | |

(52) U.S. Cl.
CPC ...... *H01L 29/7815* (2013.01); *H01L 27/0251* (2013.01); *H01L 29/0696* (2013.01); *H03K 17/145* (2013.01)

(58) Field of Classification Search
None
See application file for complete search history.

(56) References Cited

U.S. PATENT DOCUMENTS

| | | | |
|---|---|---|---|
| 4,931,844 A | 6/1990 | Zommer | |
| 5,543,632 A | 8/1996 | Ashley | |
| 6,949,961 B2 | 9/2005 | Robb et al. | |
| 7,015,745 B1 | 3/2006 | Burinskiy et al. | |
| 7,365,559 B2 | 4/2008 | Colbeck | |
| 7,759,923 B2 | 7/2010 | Miller et al. | |
| 7,960,997 B2 | 6/2011 | Williams | |
| 8,582,266 B2 | 11/2013 | Bertin et al. | |
| 8,736,314 B2 | 5/2014 | Kim | |
| 8,785,931 B2 | 7/2014 | Kinouchi et al. | |
| 8,854,065 B2 | 10/2014 | Mauder et al. | |
| 8,994,442 B2 | 3/2015 | Konstantinov | |
| 9,076,805 B2 | 7/2015 | Thiele et al. | |
| 9,397,569 B2 | 7/2016 | Ellis | |
| 9,397,657 B1 | 7/2016 | Zhao et al. | |

(Continued)

OTHER PUBLICATIONS

Xiao, Y., et al., "Current Sensing Trench Power MOSFET for Automotive Applications", 20th IEEE Applied Power Electronics Conference and Exposition, APEC vol. 2, (2005), 766-770.

*Primary Examiner* — Lincoln D Donovan
*Assistant Examiner* — Khareem E Almo
(74) *Attorney, Agent, or Firm* — Schwegman Lundberg & Woessner, P.A.

(57) ABSTRACT

A power device can be structured with a power switch having multiple arrangements such that the power switch can operate as a power switch with the capability to measure properties of the power switch. An example power device can comprise a main arrangement of transistor cells and a sensor arrangement of sensor transistor cells. The main arrangement can be structured to operate as a power switch, with the transistor cells of the main arrangement having control nodes connected in parallel to receive a common control signal. The sensor arrangement of sensor transistor cells can be structured to measure one or more parameters of the main arrangement, with the sensor transistor cells having sensor control nodes connected in parallel to receive a common sensor control signal. The sensor transistor cells can have a common transistor terminal shared with a common transistor terminal of the transistor cells of the main arrangement.

20 Claims, 7 Drawing Sheets

(56) References Cited

U.S. PATENT DOCUMENTS

| | | | |
|---|---|---|---|
| 9,425,788 B1* | 8/2016 | Jin | H01L 29/42368 |
| 9,529,016 B2 | 12/2016 | Aerts | |
| 9,683,898 B2 | 6/2017 | Sundaramoorthy et al. | |
| 9,829,387 B2 | 11/2017 | Furtner | |
| 10,156,593 B2 | 12/2018 | Neidorff | |
| 2007/0229041 A1 | 10/2007 | Oki et al. | |
| 2017/0179944 A1* | 6/2017 | Ngo | H03K 17/122 |
| 2017/0179946 A1* | 6/2017 | Turvey | H03K 5/08 |
| 2017/0302263 A1* | 10/2017 | Xu | H02M 3/158 |
| 2018/0183228 A1* | 6/2018 | Huber | G01R 19/165 |
| 2018/0313874 A1 | 11/2018 | Dix et al. | |
| 2018/0337587 A1* | 11/2018 | Mari Curbelo | H02M 5/293 |
| 2019/0326887 A1* | 10/2019 | Kaya | H03K 3/011 |
| 2019/0386654 A1* | 12/2019 | Norling | H03K 17/18 |

* cited by examiner

POWER SWITCH ARRANGEMENT

FIELD OF THE DISCLOSURE

This document relates to power devices and, in particular, to power switches.

BACKGROUND

For controlling and protection of power electronics system, the current and temperature of a power switch associated with the power electronics system need to be measured and monitored. To determine junction temperature, external temperature sensors can be used. For instance, in silicon carbide technology for a power switch, there are no internal sensors that can be implemented to provide a fast measurement with respect to junction temperature of devices used for the power switch. In such situations, an additional negative temperature sensor, NTC, is placed on the surface of the transistor of the power switch, which is quite an inaccurate method if a temperature coupling to the transistor has not been defined. In addition, there is also a propagation delay that is quite large such that the junction temperature typically cannot be monitored in real time. Since the NTC is typically one resistor, which has some thermal capacity, if the junction temperature is changed, the NTC follows the temperature with some delay. Further, the connection of the NTC to the power transistor is not ideal and the NTC also has some thermal capacitance such that the NTC has a low pass filter characteristic. In general, external temperature sensors need to be placed in vicinity of the power switch to ensure good thermal coupling. For current measurements, external sensors or an internal current mirroring method can be used. Improvements to managing power switch devices can be addressed by advances in power switch device design.

SUMMARY OF THE DISCLOSURE

In various embodiments, a power switch arrangement can be implemented in which a junction temperature of a device of the power switch is a measure of temperature of the device, and switch current of the device can be measured. The power switch arrangement can include dedicated sub-switches extracted from a main switch area, where the dedicated sub-switches can provide the mechanism to measure the junction temperature and the switch current. Some dedicated transistor cells can be extracted from the main area of transistor cells with the main area of transistor cells defining a main switch and the dedicated transistor cells defining the dedicated sub-switches. The transistor cell can include one of a number of types of transistors such as a bipolar transistor, a field effect transistor, an insulated-gate field effect transistor, or other type of transistor. Such transistors have junctions between different regions of the respective devices.

In example embodiments using insulated-gate field effect transistors, the dedicated sub-switches, defined by an arrangement of transistor cells, can be utilized to determine junction temperature by measurement of internal gate resistor. The main switch current can also be determined by using the dedicated transistor cells. The use of these dedicated transistor cells to determine the main switch current can be facilitated by a structure in which the dedicated transistor cells have a common drain with the transistor cells of the main switch. As a result of the common drain, the voltage drop of the main switch caused by the drain current can be directed to a low volt measurement system during turn-on time of the main switch. During turn-off time, the sub-switches, defined by dedicated transistor cells, separate the low voltage measurement system from a relatively high power system voltage applied to the drain node.

For example, a power switch can be provided that can comprise: a main arrangement of transistor cells arranged to operate as a power switch, with the transistor cells having control nodes connected in parallel to receive a common control signal to the transistor cells; and a sensor arrangement of sensor transistor cells arranged to measure one or more parameters of the main arrangement, with the sensor transistor cells having sensor control nodes connected in parallel to receive a common sensor control signal to the sensor transistor cells, with the sensor control nodes separate from the control nodes of the main arrangement, the sensor transistor cells having a common transistor terminal shared with a common transistor terminal of the transistor cells of the main arrangement.

A power switching method can be provided that can comprise: operating a sensor arrangement of sensor transistor cells with respect to a main arrangement of transistor cells, with the main arrangement arranged as a power switch and with the sensor transistor cells having control nodes connected in parallel, separate from the transistor cells of the main arrangement, the sensor transistor cells having a common transistor terminal shared with a common transistor terminal of the transistor cells of the main arrangement; generating a control signal to the control nodes of the sensor arrangement of sensor transistor cells; and measuring one or more parameters of the main arrangement using the sensor arrangement in response to the control signal.

In various embodiments, a power switch arrangement is provided that can comprise: a means for operating a power switch, with the means for operating the power switch having a control node to receive a control signal; and a means for measuring parameters of the means for operating the power switch, with the means for measuring the parameters having a sensor control node to receive a sensor control signal, with the sensor control node separate from the control node of the means for operating the power switch, the means for measuring the parameters having a common component shared with the means for operating the power switch.

BRIEF DESCRIPTION OF THE DRAWINGS

The drawings, which are not necessarily drawn to scale, illustrate generally, by way of example, but not by way of limitation, various embodiments discussed in the present disclosure.

DETAILED DESCRIPTION

State of the art power switches consist of several thousand transistor cells connected in parallel. The use of small transistor cells connected in parallel, using metallization technology, allows fast access to every cell. In contrast, with use of a large transistor, all relevant areas typically cannot be switched on and off at the same time. For ease of presentation, the following disclosure of an innovative approach to a power switch includes discussions related to a large number of transistor cells having insulated-gate field effect transistors (IGFET), which from historical reasons can be referred as MOSFETs, with the insulated-gate field effect transistors also referred to as transistors in these discussions. However, other types of transistor cells can be implemented in a switch arrangement including a main arrangement to operate as a power switch and a sensor arrangement to operate as a measurement sensor.

In an innovative approach, the main arrangement can be implemented as a main transistor and the sensor arrangement can operate as a sub-transistor. The sub-transistor, realized as a relatively small number of dedicated transistor-cells, can be extracted from the main area and can be utilized to measure junction temperature (Tj) and drain-source drop voltage $U_{DS}$ on the main switch. Tj can be measured by using internal gate resistor of the sub-transistor as a temperature sensor. As the sub-transistor can be structured of only a few cells, its internal gate resistance is much higher than gate resistance of the main transistor. Thus, the internal gate resistance of sub-transistor is more sensitive to determine the Tj. Moreover, the gate of the sub-transistor, separated from the gate of the main transistor, can be independently controlled and monitored for Tj determination.

The drain-source drop voltage $U_{DS}$ on the main switch can be measured by using the sub-transistor as an additional switch, separating sensitive low voltage analog-to-digital converter (ADC) from high voltage when the main switch is off. This results from structuring the sub-transistors to have a common drain with the main switch. Thus, the voltage drop of the main switch caused by the drain current can be directed to a low voltage measurement system during the turn-on time of the main switch. During turn-off time, the sub-switches separate the low voltage measurement system from the high voltage applied to the common drain.

Figure 1:
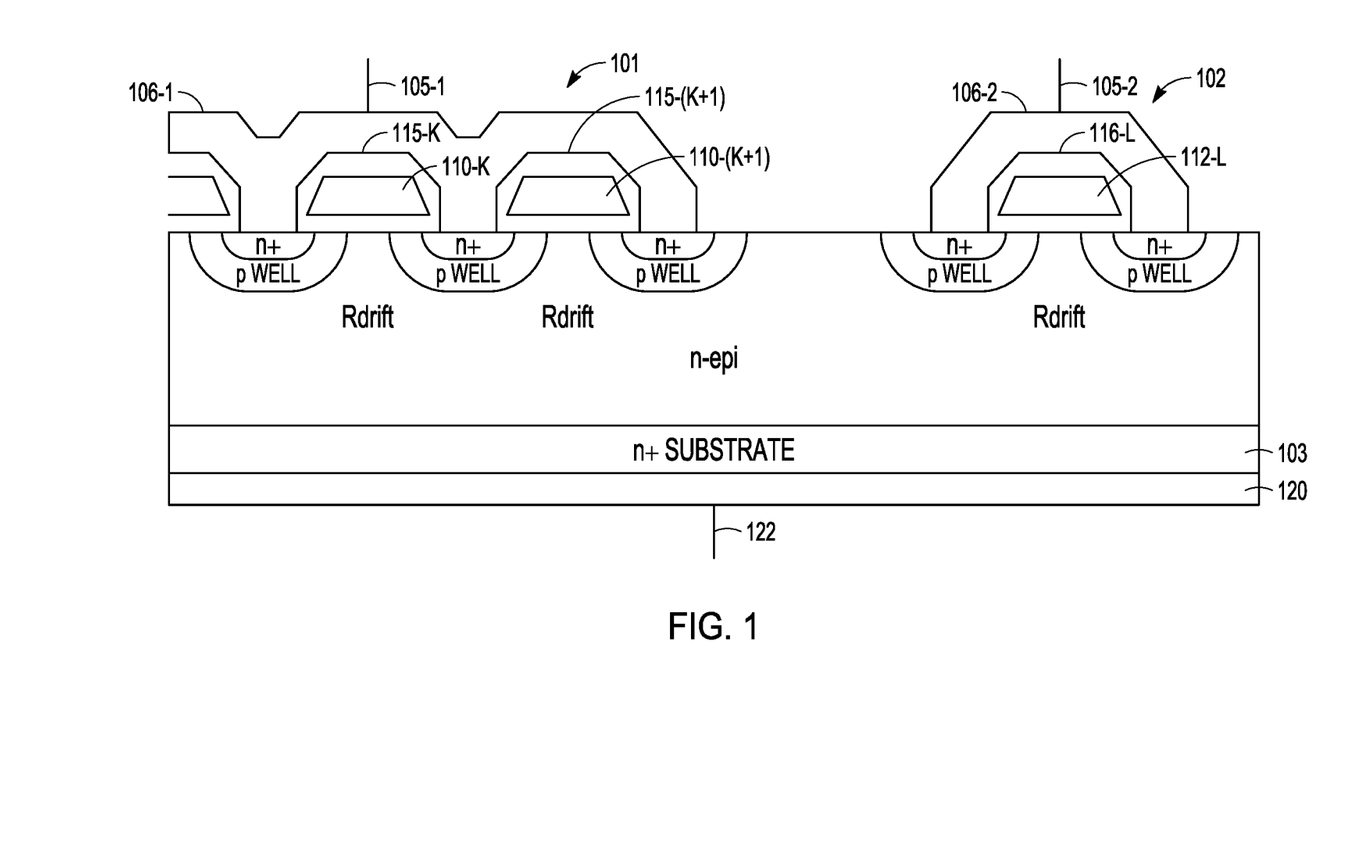
FIG. 1 illustrates an example of a cross-section of an example insulated-gate field effect transistor power device in which transistor cells are built on the top side of a substrate, according to various embodiments.

FIG. 1 illustrates a cross-section of an embodiment of an example vertical power IGFET device in which transistor cells are built on the top side of a substrate 103. In addition, the transistor cells can be implemented in a main arrangement 101 of transistor cells and a sensor arrangement 102 of sensor transistor cells. As noted, a power device can include several thousand transistor cells. The power device can be implemented in a number of material technologies such as, but not limited to, silicon (Si) technology, silicon carbide (SiC) technology, gallium nitride (GaN) technology, or combinations of these technologies or other technologies. For ease of presentation to focus on the innovative power device, a limited number of transistor cells are shown with two transistor cells of main arrangement 101 and one sensor transistor cell of sensor arrangement 102 shown. The number of transistor cells of main arrangement 101 will typically be much larger than the number of sensor transistor cells of sensor arrangement 102. For example, the ratio of the number of transistor cells of main arrangement 101 to the number of sensor transistor cells of sensor arrangement 102 can be 1000:1. For such a ratio, with the main arrangement 101 having 10,000 transistor cells, sensor arrangement 102 has 10 sensor transistor cells. A power switch arrangement can have other ratios of the number of transistor cells of main arrangement 101 to the number of sensor transistor cells of sensor arrangement 102.

In main arrangement 101, gates 110-1 . . . 110-N of the transistor cells be built in polysilicon and connected in parallel, with only gates 110-K and 110-(K+1) shown in FIG. 1. Other materials for the gate nodes can be used. Also, the n+ sources can be connected in parallel using source metallization 106-1 coupled to a source node 105-1 to a source node. Source metallization 106-1 can be implemented mostly using aluminum or copper metallization, though other metallization materials may be used. As shown in FIG. 1, a common drain 120 can be built in the backside with a drain node 122. Drain node 122 can be tied to a supply voltage.

Figure 3:
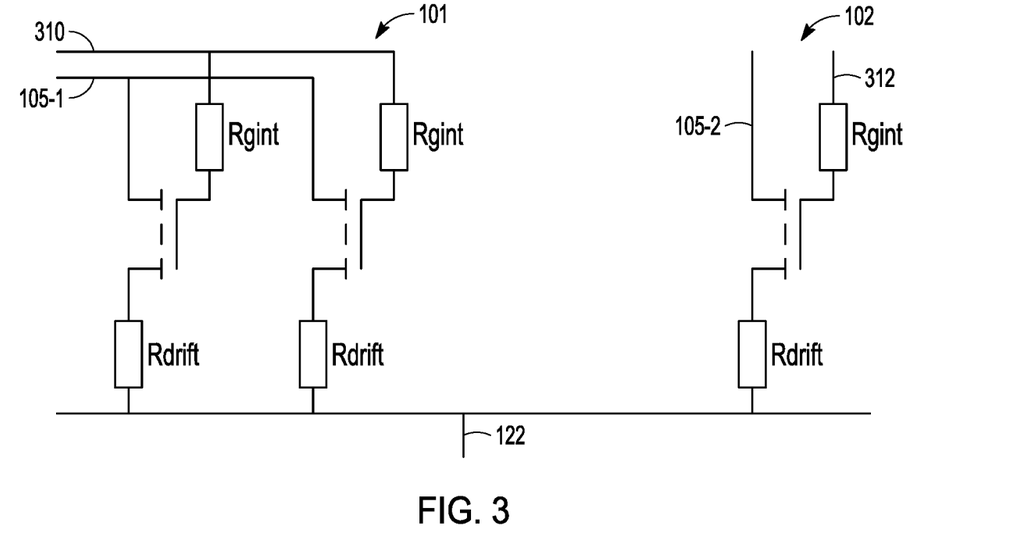
FIG. 3 shows an example of a circuit representation of FIG. 1, according to various embodiments.

With integrated circuit processing, every cell can have almost equal electrical parameters such as internal resistance Rgint, as shown in FIG. 3, and such as drift resistance, $R_{drift}$, as shown in FIGS. 1 and 3. With integrated circuit processing technology, the power IGFET device can be constructed with main arrangement 101 of transistor cells arranged to operate as a power switch, with the transistor cells having control nodes connected in parallel to receive a common control signal to the transistor cells. These control nodes are provided by gates 110-1 . . . 110-N, with only gates 110-K and 110-(K+1) shown with K<N. Each of gates 110-K and 110-(K+1) are disposed within electrically insulating gate dielectrics 115-K and 115-(K+1). The other gates of gates 110-1 . . . 110-N are structured with corresponding gate dielectrics. The gate dielectrics can be realized by gate oxides, though the gate dielectrics are not limited to oxides.

Figure 4:
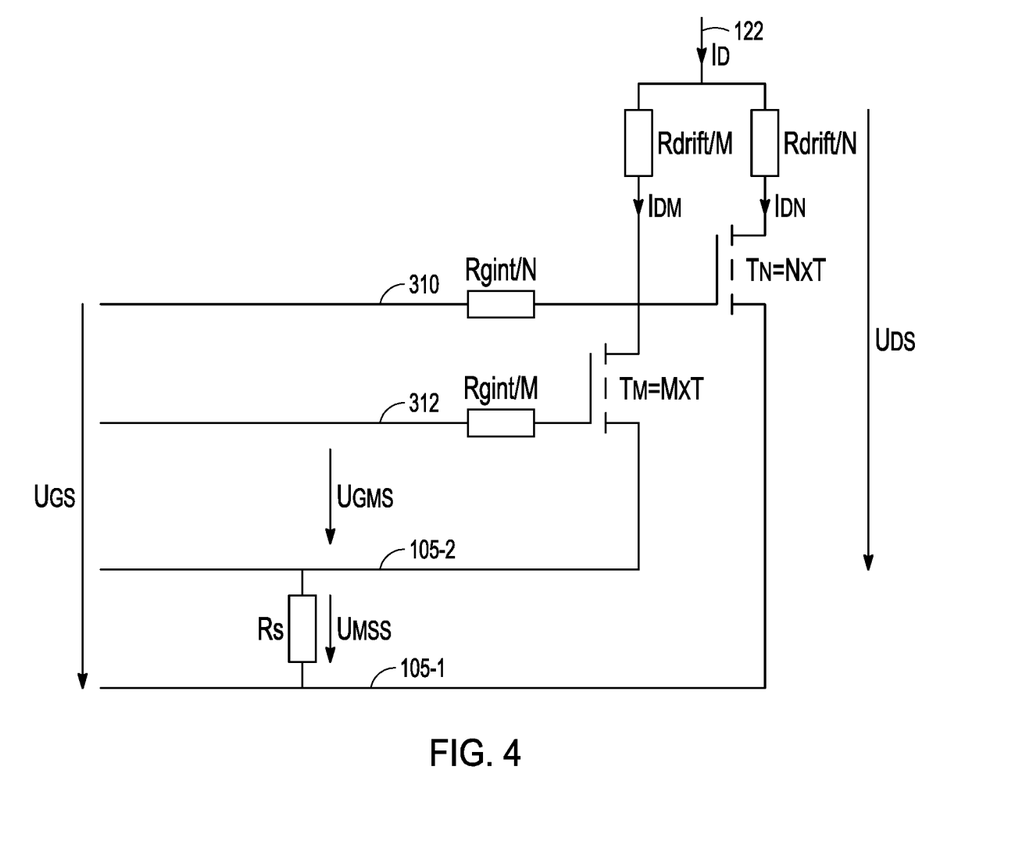
FIG. 4 shows an example of an example power switch with a main arrangement and a sensor arrangement configured with an external resistor, according to various embodiments.

Sensor arrangement 102 of sensor transistor cells can be arranged to measure one or more parameters of the main arrangement 101, with the sensor transistor cells having sensor control nodes connected in parallel to receive a common sensor control signal to the sensor transistor cells with the sensor control nodes separate from the control nodes of main arrangement 101. The sensor transistor cells have a common transistor terminal shared with a common transistor terminal of the transistor cells of main arrangement 101. Sensor arrangement 102 can be built from a whole cell array, containing main arrangement 101, as a sub-transistor, consisting of M cells with dedicated electrical parameters, by separating M gate nodes and M source nodes in the whole cell array from the gate node and the source node configuration of main arrangement 101. This sub-transistor, which can be fabricated to function as sensor arrangement 102, has dedicated internal gate-source resistance and drain-source resistance, as shown in FIG. 4, determined by the number of cells M.

Sensor arrangement 102 can include M gates with the sensor transistor cell of FIG. 1 including a gate 112-L, which can be built of polysilicon and connected in parallel to other gates nodes of sensor arrangement 102. Other materials for the gate nodes can be used. Also, n+ sources for the sensor transistors of sensor arrangement 102 can be connected in parallel using source metallization 106-2 coupled to a source node 105-2 to a source node for sensor arrangement 102. The source node 105-2 can provide a common node at which measurements are taken with the common node separate from the transistor cells of the main arrangement 101. Source metallization 106-2 can be implemented mostly using aluminum or copper metallization, though other metallization materials may be used. Gate 112-L, 1<L<M, is disposed within electrically insulating gate dielectric 116-L. The other gates of sensor arrangement 102 having gates 112-1 . . . 110-M, with only gate 112-L shown in FIG. 1, are structured with corresponding gate dielectrics. The gate dielectrics can be realized by gate oxides, though the gate dielectrics are not limited to oxides. As shown in FIG. 1, the sensor transistors of sensor arrangement 102 have a common drain 120 that is also a common drain to the transistors of main arrangement 101. The sensor transistor cell of sensor arrangement 102 is configured with the structure of the transistor cells of main arrangement 101, except gates 112-1 . . . 112-M are separated from gates 110-1 . . . 110-N that are connected in parallel in main arrangement 101, and the sources of the sensor transistors of sensor arrangement 102 are separate from the sources of the transistors of main arrangement 101.

Figure 2:
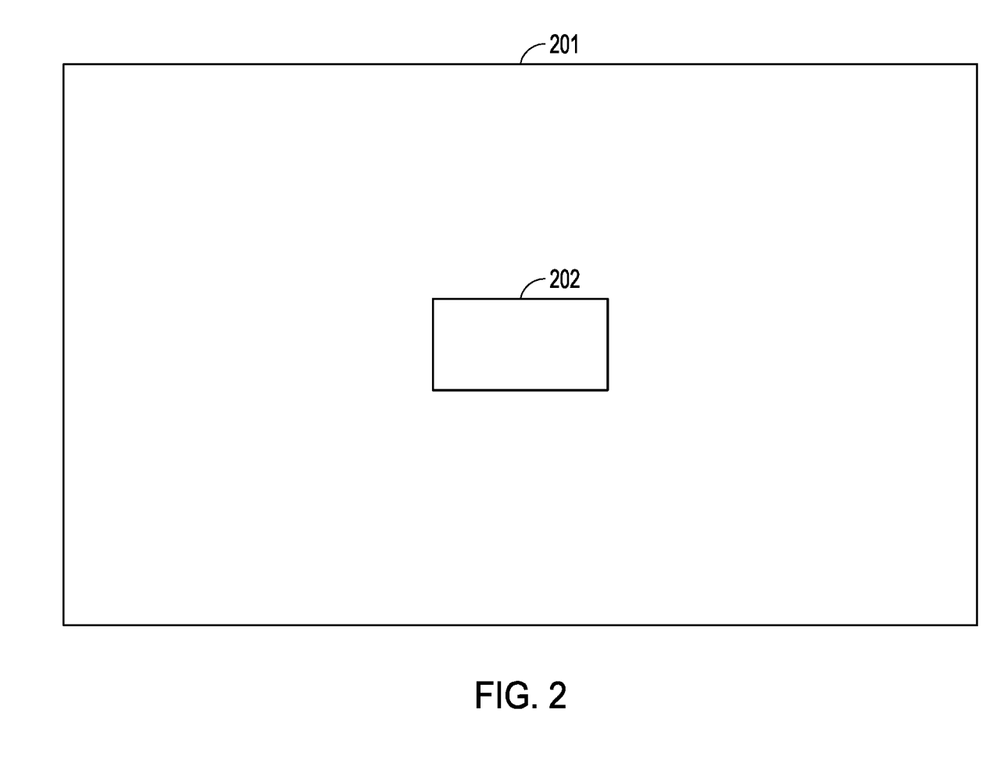
FIG. 2 illustrates a top view of an example arrangement of a region to contain the main arrangement of FIG. 1, to operate as a power switch, with respect to a region to contain the sensor arrangement of FIG. 1, according to various embodiments.

FIG. 2 shows a top view of an example arrangement of a region 201 to contain main arrangement 101 of FIG. 1, to operate as a power switch, with respect to a region 202 to contain sensor arrangement 102 of FIG. 1. The region 202 can be in the middle of the chip containing the power switch, since the middle of the chip can have the highest temperature. With the sensor transistor cells of sensor arrangement 102 between transistor cells of main arrangement 101, the sensor transistor can effectively measure an average temperature of transistors of main arrangement 101. Alternatively, since sensor arrangement 102 includes a small number of transistor cells compared to the number of transistor cells of main arrangement 101, the sensor transistor cells can be placed around the chip area. However, to avoid using a special layout to access source metallization 106-2 of the sensor transistor cells, the region 202 being within region 201 of main arrangement 101 provides for a common fabrication process as for main arrangement 101 save for the separation of the source and gates of the sensor arrangement 102 from the main arrangement 101. Other configurations of a region for main arrangement 101 with respect to a region for sensor arrangement 102 can be used.

FIG. 3 shows a circuit representation of FIG. 1. The main arrangement 101 includes a gate node 310, a source node 105-1, a drain node 122 that is common to all transistors of main arrangement 101 (only two of N transistor cells are shown). The sensor arrangement 102 includes a gate node 312, a source node 105-2, drain node 122 that is common to all sensor transistors of main arrangement 101 (only one transistor of M transistors is shown). Drain node 122 is common to all transistors of main arrangement 101 and to all transistors of sensor arrangement 102.

The sub-transistor 102 (sensor arrangement 102), consisting of M cells, can be controlled independently of the main transistor 101 (main arrangement 101), consisting of N cells, where N>>M. Unlike in known current-mirror circuits, where the gate node is common for a main-transistor and a sub-transistor, this new sub-transistor 102 construction has an independent gate node that is can be considered as an additional node. Both the main-transistor 101 and the sub-transistor 102 can be controlled from the same reference level, which can be a source node of main transistor 101. The gate node 310 of the main arrangement 101 and the gate node 312 of the sensor arrangement 102 can each be controlled separately. The resistance (Rgint/M) of gate 112-L of sensor arrangement 102 of FIG. 1 composed of a known material, such as a polysilicon gate, has a known temperature coefficient α, which for a polysilicon gate is $\alpha=9.4\times10^{-4}$ 1/K. Thus, measurement of the Rgint/M can be used to calculate the Tj. By applying a dedicated constant current into gate 112-L, it is possible to determine the junction temperature, Tj, by measuring the gate-to-source voltage of the sensor arrangement 102, $U_{GSM}$, and then calculating the Tj, where $U_{GSM}=R_{gint}(Tj)\times I_{CCS}$, where $R_{gint}$ (Tj) is the internal gate resistance that is a function of Tj and $I_{CCS}$ is a current from a constant current source to the gate having the $R_{gint}$(Tj). The same sub-transistor is used to measure drain-source voltage ($U_{DS}$) on the main transistor.

FIG. 4 shows an embodiment of an example power switch with a main arrangement, $T_N$, and a sensor arrangement, $T_M$, configured with an external resistor. FIG. 4 can be viewed as the circuit of FIG. 3 with a single external shunt resistor, $R_S$, connected between source node 105-2 of sensor arrangement 102 of FIG. 3 and source node 105-1 of main arrangement 101 of FIG. 3. The sensor sub-transistor, $T_M$, has M individual transistor cells and the main transistor, $T_N$, has N individual transistor cells, where an individual transistor cell is shown as T. As discussed with respect to FIGS. 1 and 3, $T_N$ and $T_M$ share a common drain. When $T_M$ is switched-on, the voltage $U_{MSS}$ on the resistor $R_S$ can be used to measure drain-source voltage $U_{DS}$ of the main switch $T_M$. When $T_N$ is switched-off, the signal on $R_S$ is disconnected from the drain node. The independent gate of $T_M$ is used as junction temperature sensor.

The drain current, $I_D$, is provided from drain node 122 and is divided into a drain current, $I_{DM}$, for $T_M$ and a drain current, $I_{DN}$, for $T_N$. Associated with $I_{DM}$ is internal drift resistance $R_{drift}/M$ and associated with $I_{DN}$ is internal drift resistance $R_{drift}/N$. $T_N$ has a gate node 310 and associated internal gate resistance, $R_{gint}/N$, and $T_M$ has a gate node 312 and associated internal gate resistance, $R_{gint}/M$. Shown in FIG. 4 is a drain-to-source voltage, $U_{DS}$, and a gate-to-source voltage, $U_{GS}$, for $T_N$. Also shown is gate-to-source voltage, $U_{GMS}$, for $T_M$ along with a voltage across $R_S$ that is a voltage, $U_{MSS}$, between sensor source node 105-2 and main source node 105-1.

Figure 7:
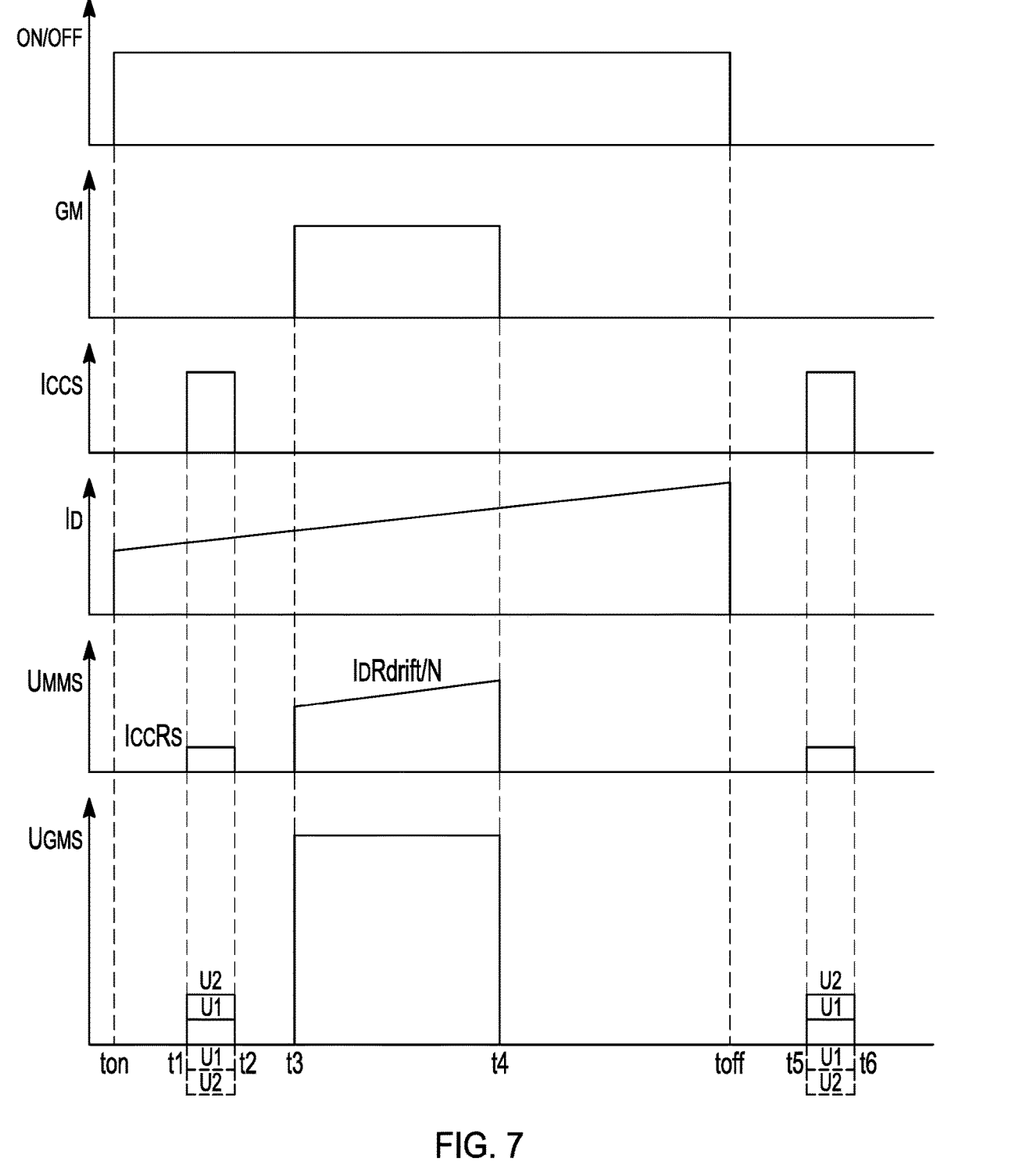
FIG. 7 shows an example of timing of signals in operation of the power switch using the control circuit of FIG. 5, according to various embodiments.

When the main switch, main transistor 101, is turned-on and then the sub-transistor 102 is turned-on during period t3-t4 in FIG. 7, the $U_{DS}$ is directed to the source node 105-2 of the sub-transistor 102. By choosing $R_S$ such that $R_S>>R_{drift}/M$, one can assume $U_{MSS}$ is equal to $U_{DS}$. This allows precise low voltage $U_{DS}$ measurement during the time that the main transistor is turned-on. Thus, the voltage drop in the main transistor 101 can be measured using the shunt resistor $R_S$. During the main transistor 101 turn-on, the $U_{DS}$ is in a range of several hundred millivolts, while during turn-off it is in a range of several hundred volts. In order to protect the low voltage $U_{DS}$ measurement system against high voltage, the sub-transistor can be turned-on after the main transistor 101 and turned-off before the turn-off of the main transistor 101. During this time period, the voltage drop $U_{MMS}$ on the $R_S$ directly follows the waveform of the drain current $I_D$. The sub-transistor $T_M$ has the same $U_{DS}$ breakdown voltage as the main transistor $T_N$ and both are controlled from the same reference level. Thus, the disclosed arrangement main transistor and sub-transistor are relatively simple to fabricate. When compared to a conventional power transistor, only two small areas including pads (gate of $T_M$, source of $T_M$) are extracted from the transistor cell array in the fabrication process.

Figure 5:
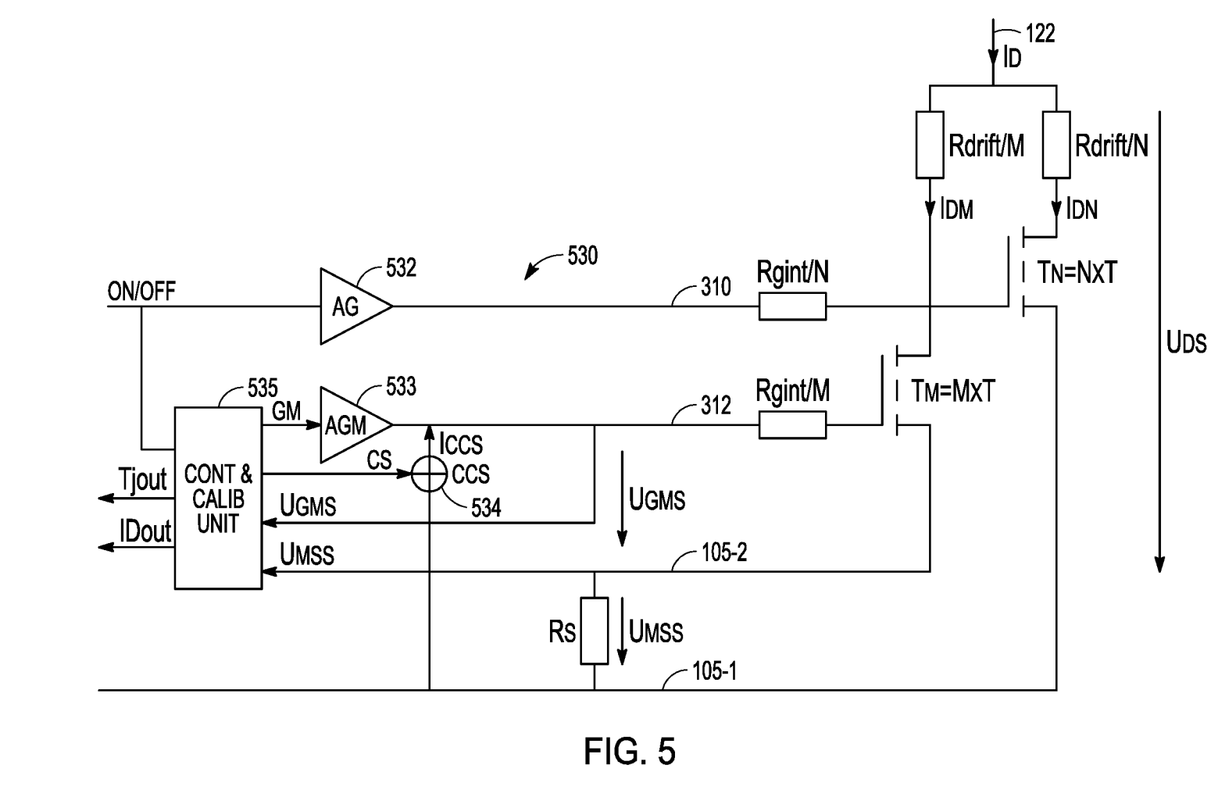
FIG. 5 shows an example of a power switch having a main transistor and sub-transistor along with a circuit to control the main transistor and the sub-transistor as well as to make measurements with respect to the main transistor, according to various embodiments.

FIG. 5 illustrates an embodiment of an example power switch having a main transistor and sub-transistor along with a control circuit 530 to control the main transistor and the sub-transistor as well as to measure Tj and $U_{DS}$. For ease of discussion, the configuration of the main transistor and the sub-transistor with an external resistor from FIG. 4 is used with the control circuit 530.

Control circuit 530 can include two gate current boosters: an automatic gain/gate driver (AG) 532 for $T_N$ and an automatic gain/gate driver (AGM) 533 for $T_M$. Control circuit 530 can also include a controlled constant current source (CCS) 534 and some logic circuits for system timing as well as analog-to-digital conversion for measurement and calibration. The logic circuits can be provided by a control and calibration unit 535. Control and calibration unit 535 can provide circuitry to: measure drain-to-source voltage of the field effect transistors of the main arrangement using the resistor; measure gate-to-source voltage of the field effect transistors of the sensor arrangement; calculate junction temperature of the field effect transistors of the sensor arrangement; calculate drain current of the main arrangement; and output values of the junction temperature and the drain current. The circuitry of control and calibration unit 535 can include logic circuitry to generate signal GM as a control to the gates of the sensor transistors that make up $T_M$, where GM is amplified by AGM 533 prior to input to control gates of $T_M$. The circuitry of control and calibration unit 535 can provide timing circuitry for the generation of GM and CS, where CS is a control signal to CCS 534. The circuitry of control and calibration unit 535 can include an analog-to-digital converter to output determined values of the junction temperature and the drain current.

In operation, control circuit 530 receives a signal at an input node to provide an on signal or an off signal to AG 532, which has an output coupled to gate node 310 of $T_N$. The output from AG 532 to gate node 310 can be used to control $T_N$ as a power switch. The on/off signal at the input node is also coupled to control and calibration unit 535. The logic in control and calibration unit 535 controls the output of GM and CS to $T_M$.

In initial operation, a known value of the internal gate resistance of $T_M$ for the room temperature (RT) or some similar temperature such as, but not limited to, 30° C. can be assumed. Alternatively, before the system is turned on, the temperature can be measured by means of one external sensor, which external measurement is not made in normal operation of the system. Control and calibration unit 535 can generate control signal CS directed to CCS 534 to provide ICCS to gate node 312 of $T_M$ that charges up the gate capacitance of $T_M$, in which voltage $U_{GMS}$ can be measured having a value less than the threshold value of $T_M$. The measured $U_{GMS}$ is equal to $R_{gint}(RT) \times I_{CCS}$ providing an initial relationship between $U_{GMS}$ and known values of $R_{gint}(RT)$ and ICCS. As temperature increases, the internal gate resistance changes according to a scaling factor.

In the measurements of the main transistor and the sub-transistor using the sub-transistor, Tj can be calculated first from a measurement of $U_{GMS}$ and $U_{DS}$ can be measured as the voltage drop across $R_S$, providing knowledge of Tj and $U_{DS}$. In addition, the temperature coefficient of $R_{drift}$ is known. Knowing Tj, $U_{DS}$, and $R_{drift}$, the drain current $I_D$ can be calculated. The determined Tj and $I_D$ can be output from control and calibration unit 535 as digital signals.

Figure 6:
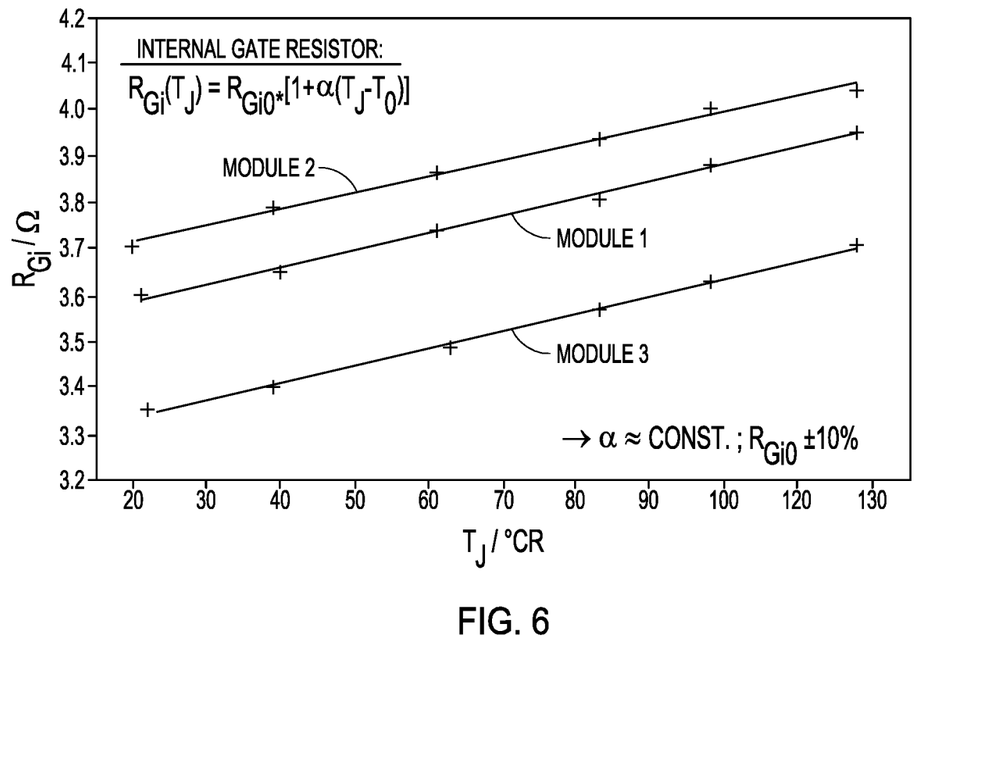
FIG. 6 shows the internal gate resistor versus junction temperature of three power modules, according to various embodiments.

With $U_{DS}=I_D R_{drift}/N$, the $I_D$ can be calculated in the control unit 535, when the $R_{drift/N}$ and Tj are known. By applying dedicated constant current $I_{CCS}$ from CCS 534 into gate node 312, it is possible to determine the junction temperature Tj by measurement of the voltage $U_{GSM}=R_{Gint}(Tj) \times I_{CCS}$ and calculation of the Tj, according to the known equation $R_{Gint}(Tj)=R_{Gint}(T_0)[1+\alpha(Tj-T_0)]$. The junction temperature $T_0$ is equal to the $T_{amb}$ during power-up of the gate driver device AGM 533, and thus can be used for calibration. FIG. 6 shows the internal gate resistor versus Tj of three power modules with a nominal value of RGi=3.3Ω.

It can be seen in FIG. 6 that the absolute resistance $R_{Gi0}$ at $T_0$=20° C. is affected by strong process variations of up to ±10%. However, the temperature coefficient $\alpha \approx 9.4 \cdot 10^{-4}$ 1/K is constant and enables a very simple calibration of the $R_{gint}$ of sub-transistor system to a certain main switch type. For these reasons, the internal gate resistor $R_{gint}$ is a promising parameter to measure Tj of a conventional power switches with good accuracy, high feasibility and in a way that is suitable for series production.

FIG. 7 illustrates timing of signals in operation of the power switch of FIG. 5 using the control circuit 530. An on/off signal is provided for $T_N$, with $T_N$ on from time=$t_{on}$ to time=$t_{off}$. Control and calibration unit 535 provides the control signal GM for $T_M$ such that $T_M$ comes on after $T_N$ comes on and goes off before $T_N$ goes off. As shown in FIG. 7, $T_M$ is on from t3 to t4, with t3>$t_{on}$ and t4<$t_{off}$. Control and calibration unit 535 provides a control signal CS to provide ICCS for a first period t1 to t2 before $T_M$ comes on at t3. Control and calibration unit 535 also provides a control signal CS to provide ICCS for a second period t5 to t6 after $T_N$ goes off at $t_{off}$. A measurement of $U_{GMS}$ is shown for the first period t1 to t2 and for the on period of $T_M$ from t5 to t6.

The value of $U_{GMS}$ with respect to a value of $U_{GMS}$ for an initial temperature, such as room temperature, or a previous measured $U_{GMS}$ can be one of two voltages. $U_{GMS}$ with ICCS applied can have a voltage increase of U2 representing that the sensor transistor junction temperature increased or a voltage drop U1 representing that the sensor transistor junction temperature decreased. The dashed lines for U1 and U2 show the change in $U_{GMS}$, when the applied ICCS current is in the negative direction. That is, the dashed lines represent a negative ICCS.

The constant current $I_{CCS}$ can be applied to the gate node 312 during the time period t1-t2 and/or t5-t6 in FIG. 7. When applying the $I_{CCS}$ at initial temperature $T_0$, the voltage drop on $R_{Gint}$ achieves the level U1, when applying the $I_{CCS}$ at operating temperature Tj, the voltage drop on $R_{Gint}$ achieves the level U2. As the current $I_{CCS}$ has constant value, the difference between U2-U1 expresses directly temperature change from the initial value $T_0$ to the operating temperature Tj. The constant current $I_{CCS}$ can have positive or negative direction, thus the voltage U1 and U2 can have positive or negative value related to the reference level, which is from source 105-1 of the main switch.

During the time that the main switch is turned-on, the $U_{DS}$ is in range of several hundred millivolts, while during turn-off it is in the range of several hundred volts. In order to protect the low voltage measurement ADC system against high voltage, the sub-transistor can be turned-on at t3 after turn-on of the main switch and turned-off at t4 before the turn-off of the main transistor. During this time period, the voltage drop $U_{MMS}$ on the $R_S$ directly follows the waveform of $I_D$. The constant current source $I_{CCS}$ impressed in the time period t1-t2 or/and t5-t6 causes voltage drop U1 or U2 used for Tj measurement. The voltage drop $I_{CCS}R_S$ can be ignored.

In various embodiments, the sensor transistor $T_M$ can be activated or switched on only when the main transistor is turned on. The timing diagram of FIG. 7 shows that the measurement transistor is turned on while the main transistor, which is the output device, is on. This timing arrangement protects an analog-to-digital converter that can be configured to sense across the shunt resistor $R_S$.

In various embodiments, a power device can comprise: a main arrangement of transistor cells arranged to operate as a power switch, with the transistor cells having control nodes connected in parallel to receive a common control signal to the transistor cells; and a sensor arrangement of sensor transistor cells arranged to measure one or more parameters of the main arrangement, with the sensor transistor cells having sensor control nodes connected in parallel to receive a common sensor control signal to the sensor transistor cells with the sensor control nodes separate from the control nodes of the main arrangement, the sensor transistor cells having a common transistor terminal shared with a common transistor terminal of the transistor cells of the main arrangement. The one or more parameters can include one or more of a voltage of the main arrangement, a current of the main arrangement, and a temperature of the main arrangement.

Variations of such a power device or similar power devices can include a number of different embodiments that may be combined depending on the application of such power devices and/or the architecture of systems in which such power devices are implemented. The transistor cells of the main arrangement can include field effect transistors having sources connected in parallel and gates arranged as the control nodes. The sensor transistor cells of the sensor arrangement can include field effect transistors having sources connected in parallel and gates arranged as the sensor control nodes. A drain can be structured as a common drain to the field effect transistors of the main arrangement and to the field effect transistors of the sensor arrangement. Variations of such a power device or similar power devices can include the sources of the field effect transistors of the main arrangement and the sources of the field effect transistors of the sensor arrangement disposed on a top side of a substrate with the common drain disposed on a backside of the substrate vertically separated from the top side. Variations of such a power device or similar power devices can include a resistor coupling the sources of the sensor transistor cells to the sources of the transistor cells of the main arrangement.

Variations of such a power device or similar power devices can include control circuitry to control operation of the main arrangement, the sensor arrangement, or the main arrangement and the sensor arrangement, to determine values of the one or more parameters, and to transmit the determined values. The control circuitry can include circuitry to turn-off the sensor arrangement before the main arrangement turns off.

Such power devices or similar power devices can include control and calibration circuitry to: measure drain-to-source voltage of the field effect transistors of the main arrangement using the resistor; measure gate-to-source voltage of the field effect transistors of the sensor arrangement; calculate junction temperature of the field effect transistors of the sensor arrangement; calculate drain current of the main arrangement; and output values of the junction temperature and the drain current.

Figure 8:
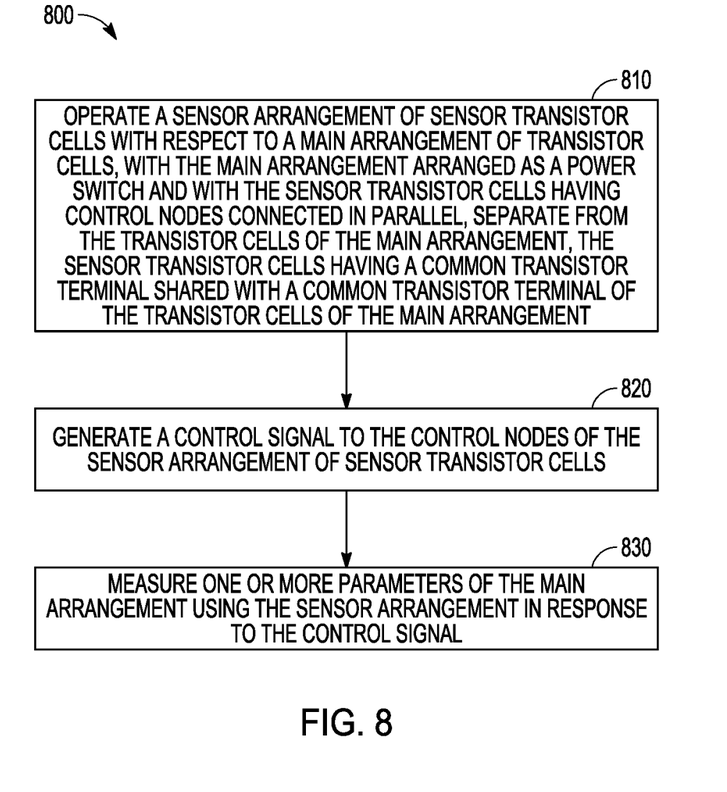
FIG. 8 is a flow diagram of features of an example method of operating a power switch, according to various embodiments.

FIG. 8 is a flow diagram of features of an embodiment of an example method 800 of operating a power switch. At 810, a sensor arrangement of sensor transistor cells is operated with respect to a main arrangement of transistor cells, with the main arrangement arranged as a power switch. The sensor arrangement of the sensor transistor cells has control nodes connected in parallel, separate from the transistor cells of the main arrangement. The sensor transistor cells have a common transistor terminal shared with a common transistor terminal of the transistor cells of the main arrangement. The sensor transistor cells can have a common node at which measurements are taken with the common node separate from the transistor cells of the main arrangement.

At 820, a control signal is generated to the control nodes of the sensor arrangement of sensor transistor cells. The control signal can be generated to the control nodes of the sensor arrangement of sensor transistor cells after receiving a signal at the control nodes of the main arrangement. Generating the control signal to the control nodes of the sensor arrangement can be performed in response to receiving the signal designating an on-event at control circuitry that is coupled to the sensor arrangement.

At 830, one or more parameters of the main arrangement are measured using the sensor arrangement in response to the control signal. Measuring the one or more parameters of the main arrangement can include measuring one or more of a voltage of the main arrangement, a current of the main arrangement, and a temperature of the main arrangement.

Variations of method 800 or methods similar to the method 800 can include a number of different embodiments that may be combined depending on the application of such methods and/or the architecture of systems in which such methods are implemented. Such methods can include turning off the sensor arrangement before turning off the main arrangement.

Variations of the method 800 or methods similar to the method 800 can include generating a constant current to gates of field effect transistors arranged as the sensor transistor cells of the sensor arrangement; measuring a gate-to-source voltage of the field effect transistors, arranged as the sensor transistor cells, using the constant current; and calculating a junction temperature from the measured gate-to-source voltage. Variations of the method 800 or methods similar to the method 800 can include measuring drain-to-source voltage of field effect transistors arranged as the transistor cells of the main arrangement using a resistor coupling sources of field effect transistors, arranged as the sensor transistor cells, to sources of the field effect transistors arranged as the transistor cells of the main arrangement; and calculating a drain current to the field effect transistors of the main arrangement and the sensor arrangement using the measured drain-to-source voltage and a calculated junction temperature of the field effect transistors of the sensor arrangement. Such a method can include outputting the drain current and the calculated junction temperature as digital signals from control and calibration circuitry coupled to the resistor and to the sensor arrangement of sensor transistor cells.

In various embodiments, a power device can comprise: a means for operating a power switch, with the means for operating the power switch having a control node to receive a control signal; and a means for measuring parameters of the means for operating the power switch, with the means for measuring the parameters having a sensor control node to receive a sensor control signal with the sensor control node separate from the control node of the means for operating the power switch, the means for measuring the parameters having a common component shared with the means for operating the power switch. The one or more parameters can include one or more of a voltage of the means for operating the power switch, a current of the means for operating the power switch, and a temperature of the means for operating the power switch.

Variations of such a power device or similar power devices can include a number of different embodiments that may be combined depending on the application of such power devices and/or the architecture of systems in which such power devices are implemented. Such power devices or similar power devices can include means for controlling operation of the means for measuring the parameters using the sensor control node, means for determining values of the one or more parameters from operating the means for measuring the parameters, and means for transmitting the determined values. Such power devices or similar power devices can include means for turning on the means for measuring the parameters after turning on the means for operating the power switch and means for turning off the means for measuring the parameters before turning off the means for operating the power switch. Such power devices or similar power devices can include means for generating a constant current and means for calculating a junction temperature, associated with the means for measuring the parameters, using the constant current.

The following are example embodiments of voltage generator circuits and methods, in accordance with the teachings herein.

An example power device 1 can comprise: a main arrangement of transistor cells arranged to operate as a power switch, with the transistor cells having control nodes connected in parallel to receive a common control signal to the transistor cells; and a sensor arrangement of sensor transistor cells arranged to measure one or more parameters of the main arrangement, with the sensor transistor cells having sensor control nodes connected in parallel to receive a common sensor control signal to the sensor transistor cells with the sensor control nodes separate from the control nodes of the main arrangement, the sensor transistor cells having a common transistor terminal shared with a common transistor terminal of the transistor cells of the main arrangement.

An example power device 2 can include features of example power device 1 and can include the one or more parameters to include one or more of a voltage of the main arrangement, a current of the main arrangement, and a temperature of the main arrangement.

An example power device 3 can include features of any of the preceding example power devices and can include control circuitry to control operation of the main arrangement, the sensor arrangement, or the main arrangement and the sensor arrangement, to determine values of the one or more parameters, and to transmit the determined values.

An example power device 4 can include features of example power device 3 or features of any of the preceding example power devices and can include the control circuitry to include circuitry to turn off the sensor arrangement before the main arrangement turns off.

An example power device 5 can include features of any of the preceding example power devices and can include the transistor cells of the main arrangement to include field effect transistors having sources connected in parallel and gates arranged as the control nodes; the sensor transistor cells of the sensor arrangement include field effect transistors having sources connected in parallel and gates arranged as the sensor control nodes; and a drain is a common drain to the field effect transistors of the main arrangement and to the field effect transistors of the sensor arrangement.

An example power device 6 can include features of example power device 5 or features of any of the preceding example power devices and can include the sources of the field effect transistors of the main arrangement and the sources of the field effect transistors of the sensor arrangement being disposed on a top side of a substrate with the common drain disposed on a backside of the substrate vertically separated from the top side.

An example power device 7 can include features of example power device 5 or features of any of the preceding example power devices and can include a resistor coupling the sources of the sensor transistor cells to the sources of the transistor cells of the main arrangement.

An example power device 8 can include features of example power device 5 or features of any of the preceding example power devices and can include control and calibration circuitry to: measure drain-to-source voltage of the field effect transistors of the main arrangement using the resistor; measure gate-to-source voltage of the field effect transistors of the sensor arrangement; calculate junction temperature of the field effect transistors of the sensor arrangement; calculate drain current of the main arrangement; and output values of the junction temperature and the drain current.

An example power device 9 can comprise: a means for operating a power switch, with the means for operating the power switch having a control node to receive a control signal; and a means for measuring parameters of the means for operating the power switch, with the means for measuring the parameters having a sensor control node to receive a sensor control signal with the sensor control node separate from the control node of the means for operating the power switch, the means for measuring the parameters having a common component shared with the means for operating the power switch.

An example power device 10 can include features of example power device 9 and can include the one or more parameters to include one or more of a voltage of the means for operating the power switch, a current of the means for operating the power switch, and a temperature of the means for operating the power switch.

An example power device 11 can include features of any of the preceding example power devices and can include means for controlling operation of the means for measuring the parameters using the sensor control node, means for determining values of the one or more parameters from operating the means for measuring the parameters, and means for transmitting the determined values.

An example power device 12 can include features of any of the preceding example power devices and can include means for turning on the means for measuring the parameters after turning on the means for operating the power switch, and means for turning off the means for measuring the parameters before turning off the means for operating the power switch.

An example power device 13 can include features of any of the preceding example power devices and can include means for generating a constant current and means for calculating a junction temperature, associated with the means for measuring the parameters, using the constant current.

An example method 1 of operating a power switch can comprise: operating a sensor arrangement of sensor transistor cells with respect to a main arrangement of transistor cells, with the main arrangement arranged as a power switch and with the sensor transistor cells having control nodes connected in parallel, separate from the transistor cells of the main arrangement, the sensor transistor cells having a common transistor terminal shared with a common transistor terminal of the transistor cells of the main arrangement; generating a control signal to the control nodes of the sensor arrangement of sensor transistor cells; and measuring one or more parameters of the main arrangement using the sensor arrangement in response to the control signal. An example method 2 of operating a power switch can include features of example method 1 of operating a power switch and can include measuring the one or more parameters of the main arrangement to include measuring one or more of a voltage of the main arrangement, a current of the main arrangement, and a temperature of the main arrangement.

An example method 3 of operating a power switch can include features of any of the preceding example methods of operating a power switch and can include generating the control signal to the control nodes of the sensor arrangement being performed in response to receiving, at control circuitry that is coupled to the sensor arrangement, a signal designating an on-event.

An example method 4 of operating a power switch can include features of any of the preceding example methods of operating a power switch and can include turning off the sensor arrangement before turning off the main arrangement.

An example method 5 of operating a power switch can include features of any of the preceding example methods of operating a power switch and can include: generating a constant current to gates of field effect transistors arranged as the sensor transistor cells of the sensor arrangement; measuring a gate-to-source voltage of the field effect transistors, arranged as the sensor transistor cells, using the constant current; and calculating a junction temperature from the measured gate-to-source voltage.

An example method 6 of operating a power switch can include features of any of the preceding example methods of operating a power switch and can include: measuring drain-to-source voltage of field effect transistors arranged as the transistor cells of the main arrangement using a resistor coupling sources of field effect transistors, arranged as the sensor transistor cells, to sources of the field effect transistors arranged as the transistor cells of the main arrangement; and calculating a drain current to the field effect transistors of the main arrangement and the sensor arrangement using the measured drain-to-source voltage and a calculated junction temperature of the field effect transistors of the sensor arrangement.

An example method 7 of operating a power switch can include features of example method 6 or features any of the preceding example methods of operating a power switch and can include outputting the drain current and the calculated junction temperature as digital signals from control and calibration circuitry coupled to the resistor and to the sensor arrangement of sensor transistor cells.

An example method 8 of operating a power switch can include features of any of the preceding example methods of operating a power switch and can include performing functions associated with any features of example power devices 1-13 and performing functions associated with any features of example power devices associated with the figures herein.

A sub-transistor with separated gate and source node can be fabricated based on existing power switch design having a main transistor. When compared to a standard power transistor, only two small areas including pads for a common gate and common source of the transistor cells that make up the sub-transistor are extracted from the transistor cell array of the power transistor. The sub-transistor can have the same $U_{DS}$ breakdown voltage as the main transistor and both can be controlled from the same reference level. Thus, the main transistor arrangement and the sub-transistor arrangement, as taught herein, can be used to make Tj and $I_D$ real time measurement without need of any additional sensors.

The arrangement using sub-transistor as a Tj and $I_D$ sensor can be applied for power converters with integrated power transistor. With such an arrangement, use of a temperature sensor and drain current sensor, mostly implemented by integrated shunt resistor and high speed operational amplifier, can be eliminated. This arrangement is sufficient for internal protection and for telemetry of high performance controller.

Another application for the arrangement using sub-transistor can be implemented as smart gate driver for industrial/automotive power-inverter and power-converter with external power switches. This sub-transistor approach offers miniaturization with no additional sensors, integration, increased reliability and lower system costs.

Another application for the arrangement using sub-transistor can be implemented in SiC or GaN technology. The arrangement using sub-transistor can provide a mechanism for very fast Tj and Id detection, which can enhance SiC or GaN applications. This enhancement occurs because the sub-transistor has very small area and can effectively have an ideal thermal coupling to the power switch without any signal delay, since the sub-transistor can be extracted from the transistor cells of the power switch.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description.

What is claimed is:

1. A power device comprising:
   a main arrangement of transistor cells arranged to operate as a power switch, with the transistor cells having control nodes connected in parallel to receive a common control signal to the transistor cells; and
   a sensor arrangement of sensor transistor cells arranged to measure one or more parameters of the main arrangement, with the sensor transistor cells having sensor control nodes connected in parallel to receive a common sensor control signal to the sensor transistor cells with the sensor control nodes separate from the control nodes of the main arrangement, the sensor transistor cells having a common transistor terminal to the sensor transistor cells that is shared with a common transistor terminal to the transistor cells of the main arrangement, wherein the transistor cells of the main arrangement and the sensor transistor cells of the sensor arrangement have a same type of transistor structure in a substrate common to the main arrangement and the sensor arrangement.

2. The power device of claim 1, wherein the one or more parameters include one or more of a voltage of the main arrangement, a current of the main arrangement, and a temperature of the main arrangement.

3. The power device of claim 1, wherein the power device includes control circuitry to control operation of the main arrangement, the sensor arrangement, or the main arrangement and the sensor arrangement, to determine values of the one or more parameters, and to transmit the determined values.

4. The power device of claim 3, wherein the control circuitry includes circuitry to turn off the sensor arrangement before the main arrangement turns off.

5. The power device of claim 1, wherein the transistor cells of the main arrangement include field effect transistors having sources connected in parallel and gates arranged as the control nodes; the sensor transistor cells of the sensor arrangement include field effect transistors having sources connected in parallel and gates arranged as the sensor control nodes; and a drain is a common drain to the field effect transistors of the main arrangement and to the field effect transistors of the sensor arrangement.

6. The power device of claim 5, wherein the sources of the field effect transistors of the main arrangement and the sources of the field effect transistors of the sensor arrangement are disposed on a top side of a substrate with the common drain disposed on a backside of the substrate vertically separated from the top side.

7. The power device of claim 5, wherein the power device includes a resistor coupling the sources of the sensor transistor cells to the sources of the transistor cells of the main arrangement.

8. The power device of claim 5, wherein the power device includes control and calibration circuitry to:
measure drain-to-source voltage of the field effect transistors of the main arrangement;
measure gate-to-source voltage of the field effect transistors of the sensor arrangement;
calculate junction temperature of the field effect transistors of the sensor arrangement;
calculate drain current of the main arrangement; and
output values of the junction temperature and the drain current.

9. A method of operating a power switch, the method comprising:
operating a sensor arrangement of sensor transistor cells with respect to a main arrangement of transistor cells, with the main arrangement arranged as a power switch and with the sensor transistor cells having control nodes connected in parallel, separate from the transistor cells of the main arrangement, the sensor transistor cells having a common transistor terminal to the sensor transistor cells that is shared with a common transistor terminal to the transistor cells of the main arrangement, wherein the transistor cells of the main arrangement and the sensor transistor cells of the sensor arrangement have a same type of transistor stricture in a substrate common to the main arrangement and the sensor arrangement;
generating a control signal to the control nodes of the sensor arrangement of sensor transistor cells; and
measuring one or more parameters of the main arrangement using the sensor arrangement in response to the control signal.

10. The method of claim 9, wherein measuring the one or more parameters of the main arrangement includes measuring one or more of a voltage of the main arrangement, a current of the main arrangement, and a temperature of the main arrangement.

11. The method of claim 9, wherein generating the control signal to the control nodes of the sensor arrangement is performed in response to receiving, at control circuitry that is coupled to the sensor arrangement, a signal designating an on-event.

12. The method of claim 9, wherein the method includes turning off the sensor arrangement before turning off the main arrangement.

13. A method of operating a power switch, the method comprising:
operating a sensor arrangement of sensor transistor cells with respect to a main arrangement of transistor cells, with the main arrangement arranged as a power switch and with the sensor transistor cells having control nodes connected in parallel, separate from the transistor cells of the main arrangement, the sensor transistor cells having a common transistor terminal shared with a common transistor terminal of the transistor cells of the main arrangement;
generating a control signal to the control nodes of the sensor arrangement of sensor transistor cells;
measuring one or more parameters of the main arrangement using sensor arrangement in response to the control signal;
generating a constant current to gates of field effect transistors arranged as the sensor transistor cells of the sensor arrangement;
measuring a gate-to-source voltage of the field effect transistors, arranged as the sensor transistor cells, using the constant current; and
calculating a junction temperature from the measured gate-to-source voltage.

14. The method of claim 9, wherein the method includes:
measuring drain-to-source voltage of field effect transistors arranged as the transistor cells of the main arrangement using a resistor coupling sources of field effect transistors, arranged as the sensor transistor cells, to sources of the field effect transistors arranged as the transistor cells of the main arrangement; and
calculating a drain current to the field effect transistors of the main arrangement and the sensor arrangement using the measured drain-to-source voltage and a calculated junction temperature of the field effect transistors of the sensor arrangement.

15. The method of claim 14, wherein the method includes outputting the drain current and the calculated junction temperature as digital signals from control and calibration circuitry coupled to the resistor and to the sensor arrangement of sensor transistor cells.

16. A power device comprising:
a means for operating a power switch, with the means for operating the power switch having a control node to receive a control signal; and
a means for measuring parameters of the means for operating the power switch, with the means for measuring the parameters having a sensor control node to receive a sensor control signal with the sensor control node separate from the control node of the means for operating the power switch, the means for measuring the parameters having a common component shared with the means for operating the power switch, wherein the means for operating the power switch is disposed in a region of a chip with the means for measuring parameters of the means for operating the power switch disposed in the region arranged to measure an average temperature of the means for operating the power switch.

17. The power device of claim 16, wherein the one or more parameters include one or more of a voltage of the means for operating the power switch, a current of the means for operating the power switch, and a temperature of the means for operating the power switch.

18. The power device of claim 16, wherein the power device includes means for controlling operation of the means for measuring the parameters using the sensor control node, means for determining values of the one or more parameters from operating the means for measuring the parameters, and means for transmitting the determined values.

19. The power device of claim 16, wherein the power device includes means for turning on the means for measuring the parameters after turning on the means for operating the power switch, and means for turning off the means for measuring the parameters before turning off the means for operating the power switch.

20. A power device comprising:
- a means for operating a power switch, with the means for operating the power switch having a control node to receive a control signal; and
- a means for measuring parameters of the means for operating the power switch, with the means for measuring the parameters having a sensor control node to receive a sensor control signal with the sensor control node separate from the control node of the means for operating, the power switch, the means for measuring the parameters having a common component shared with the means for operating the power switch;
- means for generating a constant current; and
- means for calculating a junction temperature, associated with the means for measuring the parameters, using the constant current.

\* \* \* \* \*

UNITED STATES PATENT AND TRADEMARK OFFICE
CERTIFICATE OF CORRECTION

PATENT NO. : 10,903,355 B1  
APPLICATION NO. : 16/698359  
DATED : January 26, 2021  
INVENTOR(S) : Bernhard K Strzalkowski Page 1 of 1

It is certified that error appears in the above-identified patent and that said Letters Patent is hereby corrected as shown below:

In the Claims

In Column 15, Line 60, in Claim 9, delete "stricture" and insert --structure-- therefor In Column 16, Line 28, in Claim 13, after "using", insert --the--

In Column 18, Line 13, in Claim 20, delete "operating," and insert --operating-- therefor Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*